United States Patent [19]

Hochberg

[11] 3,912,557

[45] Oct. 14, 1975

[54] METHOD FOR FABRICATING PLANAR SEMICONDUCTOR DEVICES

[75] Inventor: Arthur K. Hochberg, Torrance, Calif.

[73] Assignee: TRW Inc., Los Angeles, Calif.

[22] Filed: May 2, 1974

[21] Appl. No.: 466,212

[52] U.S. Cl. ................ 148/187; 148/175; 148/188; 357/59

[51] Int. Cl.[2] ........................................ H01L 21/385

[58] Field of Search ..................................... 148/187

[56] References Cited

UNITED STATES PATENTS 3,460,007 8/1969 Scott, Jr. ...................... 148/187 UX 3,725,150 4/1973 George ............................... 148/187

3,771,218 11/1973 Langdon ......................... 148/187 X

*Primary Examiner*—L. Dewayne Rutledge

*Assistant Examiner*—J. M. Davis

[57] ABSTRACT

A planar semiconductor device is fabricated by a method utilizing preferential passivation and etching steps whereby critical registrations of masking layers are eliminated and diffusion junctions are protected against ion poisoning and metal shorting.

13 Claims, 8 Drawing Figures

METHOD FOR FABRICATING PLANAR SEMICONDUCTOR DEVICES

BACKGROUND OF THE INVENTION

1. Field of the Invention

The present invention generally relates to the fabrication of semiconductor devices and, more particularly, to a method of fabricating planar semiconductor transistors whereby critical alignment in registration steps normally preceding the disposition of emitter dopant and opening of contact regions are eliminated.

2. Prior Art

Registration of adjacent diffusion areas and layers on a planar semiconductor substrate has been a continuing problem in the semiconductor industry. As a corollary problem the ability to accurately register consecutive masking patterns has increased in difficulty as the active area geometries have approached the limits of the photolithographic definition. In addition, use of larger wafer sizes also increase the cumulative effect of run out errors and registration misalignments.

The prior art discloses a number of semiconductor device fabrication methods which have been used in the industry to increase registration accuracy as well as reduce yield losses. The disclosed methods have attacked the problem by improving the masking processes, the fabircation techniques of the masks and in the design of integrated circuit structures themselves. The improved process steps disclosed by the prior art continue to exhibit inherent problems. Registration of the underlying pattern or array has been improved by the use of fiducial marks on the mask and the underlying array in the substrate A star or a cross, placed in each circuit pattern and in each unit pattern on the mask, can be manually registered as determined by optical means. The mask array is manually oriented by a skilled operator to achieve the best possible registration of fiducial marks across the entire wafer. Although this crude alignment technique provides for a gross registration of the mask array to the underlying array on the substrate, it does not solve the problem of run out. Run out is the additive displacement error across the mask pattern due to the cumulative effect of small discrepancies in spacing between each circuit unit on the mask and between circuit units in the underlying substrate.

The present invention substanially resolves some of the problems left unsolved by the methods disclosed by the prior art. The present invention is more direct and less costly since it does not alter the semiconductor device design itself. The present invention allows the formation of diffusion regions and metal contact areas without the use of critical photomask alignment.

SUMMARY OF THE INVENTION

The present invention substantially eliminates the critical steps previously used to form the underlying diffusion regions and contact areas of the base and emitter regions in a planar semiconductor device. The present invention utilizes the principles that semiconductive material is permeable to the dopants which are used to define the conductivity type; that semiconductive crystalline material can be epitaxially grown on a crystal substrate while polycrystalline material is grown on amorphous insulating layers, and that by the choice of selective crystallographic orientations or dopant levels, semiconductive devices can be designed such that certain portions of the structure are preferentially etched. The invention has the additional benefit that shallow junction regions are protected from exposure to foreign ions since the method of removing an overlying dopant-bearing glass by washing out with an etchant, a step which is normally performed to re-open the contact areas after the diffusion regions have been formed is not required.

The present invention method utilizes a series of steps which are intended to provide a more reliable emitter regions, both in geometry control and junction protection, than that which is generally incorporated in an interdigitated transistor. In addition, the present invention method eliminates the critical alignment steps used to align micron and sub-micron openings in dielectric films. The present invention utilizes process steps whereby interdigitated base and emitter regions are selectively exposed through the sequential diffustion and etching of alternate silicon dioxide, silicon nitride and silicon dioxide films. After the emitter contact regions are properly defined by selective etching, a layer of crystalline silicon is grown on the wafer at the exposed emitter contact regions with polycrystalline material deposited elsewhere. An anisotropic silicon etch properly removes the polycrystalline material in a manner which eliminates the previously required critical photoresist-mask alignment steps which were required to clean regions identified for the emitter and base contacts.

It is therefore an object of the present invention to provide an improved method for fabricating interdigitated semiconductor devices.

It is another object of the present invention to provide a more reliable emitter for interdigitated microwave transistors.

It is still another object of the present invention method to eliminate critical alignment steps for defining openings in dielectric films.

It is yet another object of the present invention to provide a mentod to protect the emitter-base junction during the metallization steps incident to the fabrication of transistors.

The novel features which are believed to be characteristic of the invention, both as to its organization and method of operation, together with further objectives and advantages thereof, will be better understood from the following description considered in connection with the accompanying drawing in which a presently preferred embodiment of the invention is illustrated by way of example. It is to be expressly understood, however, that the drawing is for the purpose of illustration and description only and is not intended as a definition of the limits of the invention.

DESCRIPTION OF THE PRESENTLY PREFERRED EMBODIMENT

Figures 1, 2:
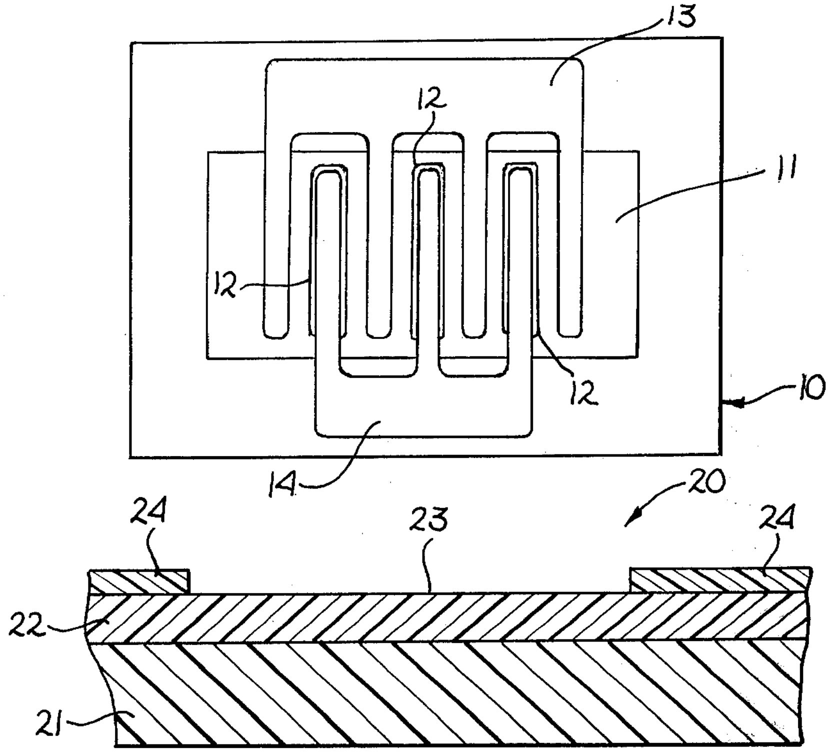
FIG. 1 is a top plan view of a typical transistor structure utilizing an interdigitated topology formed by the present invention method.
FIG. 2 is a cross-sectional view of a semiconductor substrate after the first passivating oxide coating has been partially removed.

The present invention method is typically carried out to fabricate a transistor chip 10 which utilizes a topological geometry which is best seen by reference to FIG. 1. Transistor chip 10 is fabricated from a semiconductor wafer which is typically silicon of N-type conductivity, but other conventional semicondcutor materials and doping could be utilized. The wafer of N-type conductivity is typically the collector region of transistor chip 10. Base region 11 is formed in transistor chip 10 with emitter regions 12 being disposed within base region 11 in a manner which creates the interdigitated base and emitter regions shown in FIG. 1. Interdigitated base and emitter regions 11 and 12 are formed by execution of the component steps of the present invention method. Electrical contact to the active regions of transistor chip 10 can be made by disposing metallized layers 13 and 14 on the finger-like base and emitter regions 11 and 12 respectively. Metal layers 13 and 14 are fabricated of conventional contact metals. Metal layers 13 and 14 are disposed upon active regions 11 and 12 by conventional methods such as vacuum evaporation, the deposition of such contact metals and the processing thereof being improved by the present invention method.

The ability to fabricate transistor chip 10 having an interdigitated topology in accordance with the present invention method is best seen by reference to FIGS. 2–7. Referring now to FIG. 2 of the drawing, there is shown therein substrate layer 20 comprising a single crystal of silicon doped to an N-plus level 21 and level 22 of N-type conductivity. Silicon substrate 20 is oriented such that the substrate active surface 23 is approximately oriented in a crystallographic direction which is more etch resistant than silicon of a polycrystalline nature. To achieve the desired results silicon substrate 20 may be oriented such that the active surface 23 is in a pseudo-direction. Pseudo-direction is understood to mean that the actual direction may be 2° to 5° from the actual normal orientation of the substrate surface 23. The pseudo-direction of surface 23 will avoid a rippling effect on the surface of epitaxial silicon which is subsequently grown upon the substrate 20.

As will be described in connection with FIG. 5, the epitaxially grown silicon will have the same crystallographic orientation as the underlying substrate and may further depart from a perfect crystalline structure by stacking faults and twinning. The highly doped region of the substrate 20 allows good electrical and thermal connection to a common plane underlying the crystalline substrate. The active regions of transistor 10 are formed in the less highly doped region 22 of the substrate 20.

Referring again to FIG. 2, a first pasivating oxide layer 24 of silicon dioxide ($SiO_2$) is thermally grown or deposited upon the substrate surface. Through the use of conventional photolithographic techniques, a mask is laid upon the silicon dioxide layer 24 and a pattern exposed thereon whereby a selected portion of layer 24 is subsequently exposed to an etchant and washed away. The underlying substrate surface 23 opened is a large region which shall become the base diffusion area in which the emitter regions will be subsequently diffused, thereby forming, as in this example, an interdigitated planar transistor (FIG. 1). The photolithographic steps defined hereinabove have no critical alignment requirements inasmuch as this masking step itself defines the active regions to be subsequently formed in the semiconductor substrate 20 therefore virtually no registration requirements exist.

Figure 3:
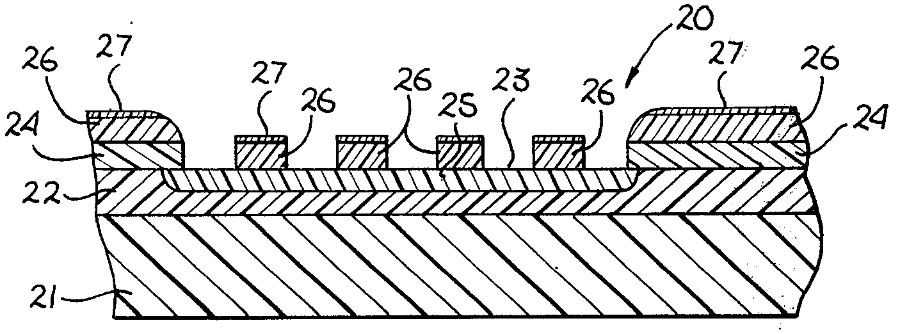
FIG. 3 is a cross-sectional view of the semiconductor substrate shown in FIG. 2 after second and third passivating layers have been disposed thereon and etched to define the base and emitter regions.

Referring now to FIG. 3, a P-type region 25 is diffused into the lightly doped N-type region 22 of the substrate 20. The first passivating silicon dioxide layer 24 shown in FIG. 2 serves as the masking layer for this diffusion step. A second passivating layer 26 is disposed upon the surface of the substrate 20 and consists of material which is not susceptible to etching by the class of etchants which are effective on silicon dioxide layer 24. Although the scope of the present invention is broad enough to encompass use of a number of alterantive materials, passivating layer 26 is preferably fabricated of silicon nitride ($Si_3N_4$). A third passivating layer 27 of silicon dioxide is then deposited on the surface of silicon nitridge layer 26. The sequential layers 24, 26 and 27 of $SiO_2$, $Si_3N_4$ and $SiO_2$ respectively are necessary insasmuch as the etchant for silicon nitride is a solution of hot phosphoric acid under which standard photoresistive masks could not effectively function. A photoresistive mask is then deposited on silicon dioxide layer 27 and defines the contact openings which shall be subsequently made in silicon nitride layer 26 to expose the contact areas of the substrate 20 which shall form the emitter and base contact openings. The proceudre defined hereinabove is a gross masking step inasmuch as registration errors of the contact openings with respect to base region 25 are not critical.

Figure 4:
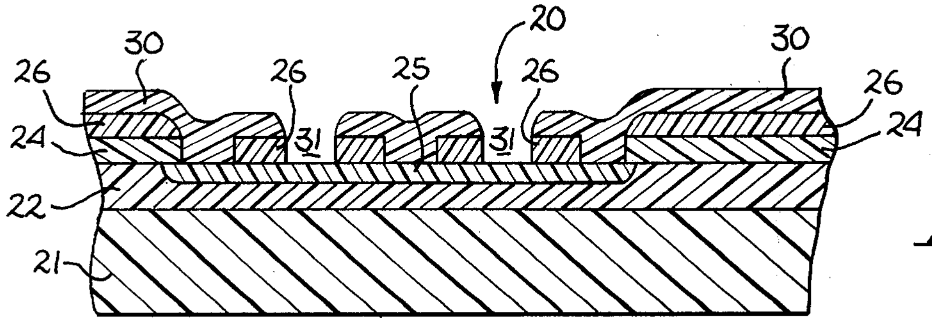
FIG. 4 is a cross-sectional view of the substrate shown in FIG. 3 after the base contacts have been masked by an oxide layer.

The portion of silicon dioxide layer 27, not protected by photoresist, is etched away by a suitable etchant such as a solution of hydrofluoric acid. The photoresist is then removed by conventional solvents and the remaining portions of silicon dioxide layer 27 act as a mask during hot phosphoric acid etching of silicon notride layer 26. As shown in FIG. 4, a passivating silicon dioxide mask 30 is then deposited over the structure of substrate 20. Silicon dioxide layer 30 is similar to silicon dioxide layer 27. A photoresistive mask is applied to the exposed surface of passivating layer 30 and openings 31 etched therein overlying those regions which shall subsequently become the emitter contact openings. As with the previous steps of the present invention method, the described photolithographic step does not involve critical alignment inasmuch as the openings 31 in the photoresistive mask only need be larger than the underlying emitter contact areas, but not so large as to include the adjacent, underlying contact areas which shall subsequently become the base contact openings. The etchant used to form openings 31 will not attack silicon nitride layer 26.

Figure 5:
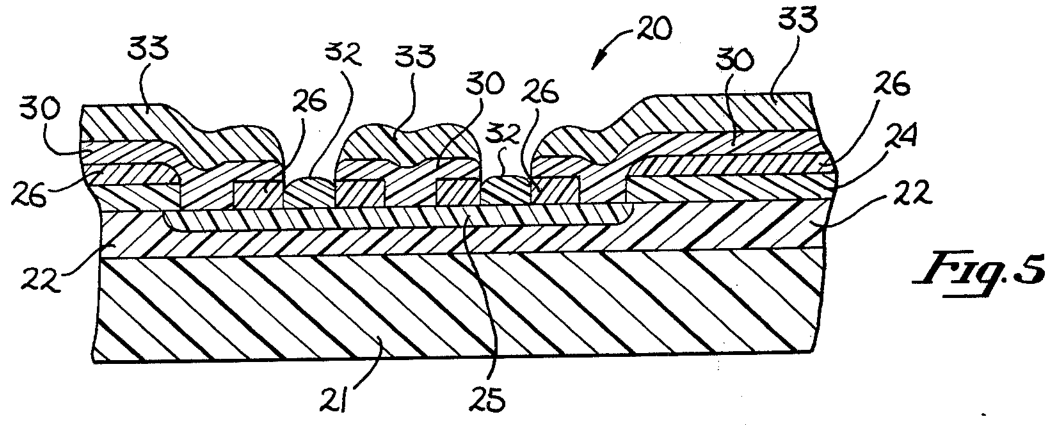
FIG. 5 is a cross-sectional view of the substrate shown in FIG. 4 after an epitaxial layer of silicon has been grown in the emitter region.

The next step of the present invention method can be best seen in FIG. 5. A semiconductor silicon layer 32 is epitaxially grown upon substrate surface 23 in openings 31. In those regions which shall become the emitter contact areas, the epitaxially grown silicon 32 grows as a pseudo-crystal. By pseudo-crystal, it is to be understood that the perfection of layer 32 need not be equal to that of substrate 20. During the epitaxial growth, there are portions 33 of silicon which are not grown over the silicon substrate surface 23 but formed upon the passivating silicon dioxide mask 30. Silicon portions 33 grow as polycrystalline silicon. The silicon which is deposited comprises a dopant and may be grown at a temperature as low as 800°C instead of the customary temperature range of 900°–1100°C. Growth at the defined temperature will allow the creation of shallow N-type diffusion regions in the P-type base regions 25. The dopant in the epitaxially grown silicon 32 is of the opposite conductivity type as that comprising underlying base diffusion regions 25. Although the scope of the present invention is broad enough for application to substantially all types of semiconductor electrical translating devices, the present invention method is shown being used to fabricate an NPN interdigitated, planar transistor.

Figure 6:
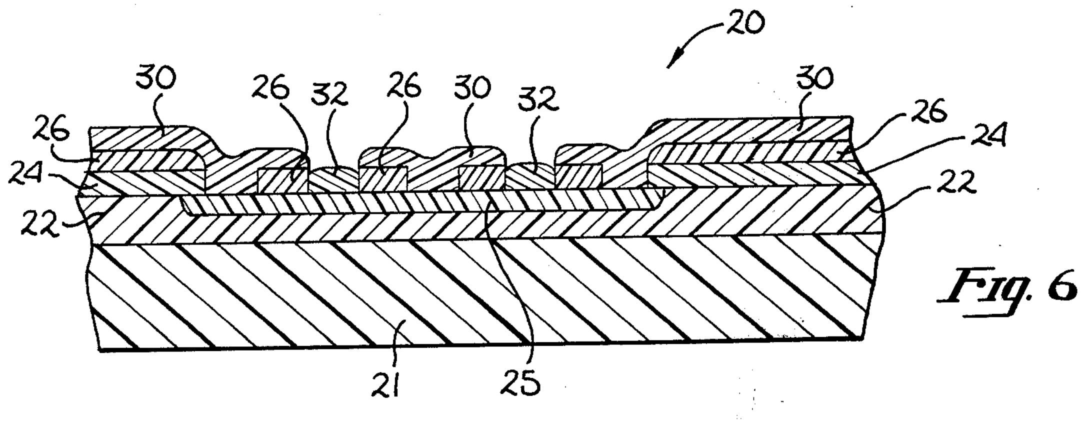
FIG. 6 is a cross-sectional view of the substrate shown in FIG. 5 after the polycrystalline semiconductor material has been removed.

The next steps of the present invention method are shown in FIG. 6 wherein wafer 20 has been subjected to an anisotropic etchant. The class of anisotropic etchants includes most etchants commonly used, and more particularly, may be a solution of potassium hydroxide and isopropyl alcohol or combinations of nitric, acetic and hydroflouric acids, etc. The anisotripic etchant will dissolve the portions 33 of polycrystalline silicon at a rate of 20–40 times greater than that of the removel rate for the pseudocrystalline silicon comprising the epitaxially grown regions 32. The result is that the epitaxially grown silicon 32 is left in place and the base contact regions remain protected by the passivating silicon dioxide layer 30.

Figure 7:
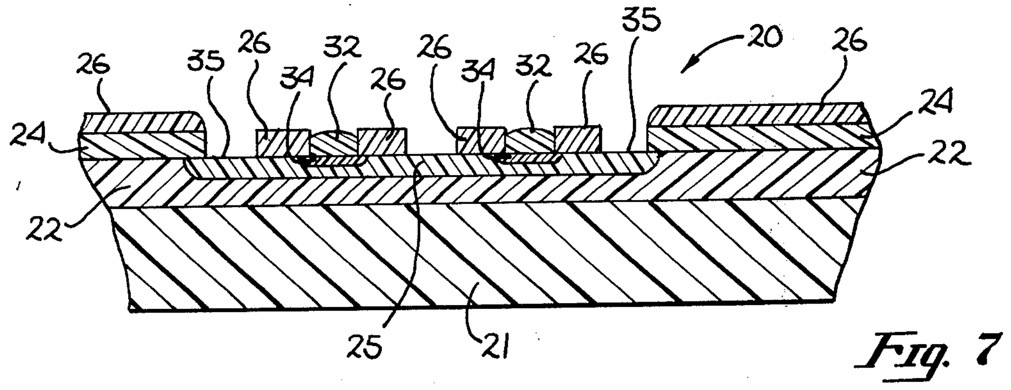
FIG. 7 is a cross-sectional view of the substrate shown in FIG. 6 after the oxide mask has been removed exposing the base region while leaving the emitter contact areas covered by the epitaxial semiconductor material.

Referring now to FIG. 7, wafer 20 is shown after diffusion of the emitter regions 34 and silicon dioxide layer 30 has been removed by a suitable etchant. As in the diffusion step whereby base region 25 was formed, emitter regions 34 are formed by heating wafer 20 to a temperature and for a time sufficient to diffuse emitter regions 34 to a suitable depth if such depth was not achieved during silicon deposition. Base contact regions 35 of diffused base region 25 are now open and subsequent metallization to the base contact regions 35 may be made. In addition, metallized contact members can be disposed upon the exposed emmiter contact regions 32.

Figure 8:
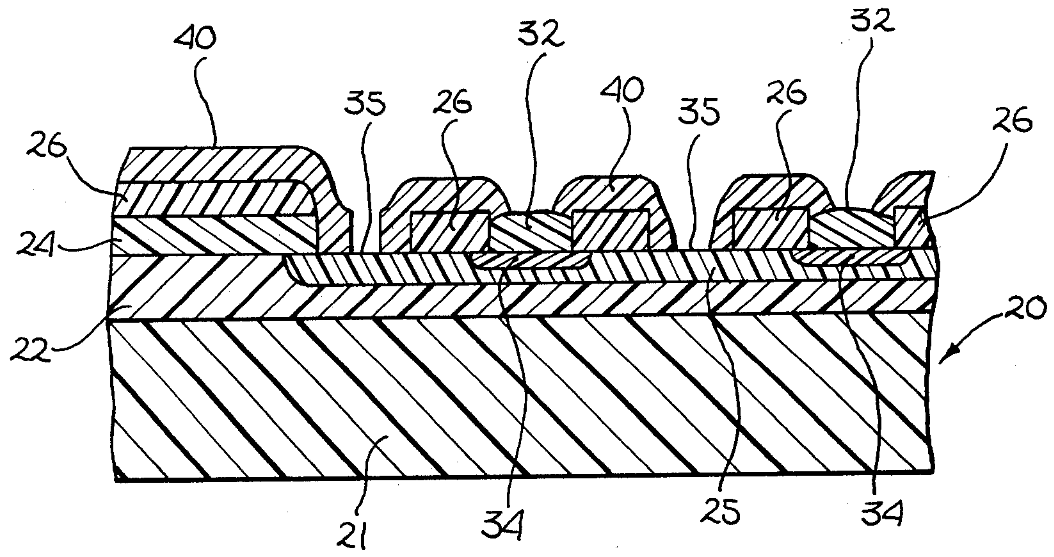
FIG. 8 is a cross-sectional view of a substrate having larger geometrical regions being processed in accordance with another form of the present invention.

Referring now to FIG. 8, a cross-sectional view of a semiconductor wafer 40 is shown, wafer 40 having active regions of sufficiently large geometry to permit the formation of second contacted devices. Since most of the process steps utilized to form the device shown in FIG. 8 are the same as those previously described, reference numberals used in FIG. 8 will be the same as those described hereinabove where the reference numeral describes like elements. Following the precess steps used in connection with the discussion of FIG. 7, passivating layer 40 of silicon dioxide is disposed upon the exposed silicon nitride layer 26. Since the wafer described in connection with FIG. 8 has sufficiently large geometries, conventional photolithographic techniques are utilized to open openings in silicon dioxide layer 41 to expose appropriate emitter and base areas 32 and 35 respectively.

It can therefore be seen that the present invention method requires no masking steps which would entail critical registration or alignment. In addition, the epitaxially grown emitter regions 32 completely cover the portions of the substrate surface 23 wherein the emitter regions 34 are to be found and they, therefore, protect the emitter-base junctions from exposure to foreign ions during subsequent processing steps. This is partucularly important in microwave interdigitated transistors where the emitter and base regions may typically have 50 to 100 contact areas which may require micron or submicron openings. In such cases where the emitter diffusion region is shallow, there is great danger of yield loss when dopant bearing glass (which had been deposited in the emitter contact openings in order to diffuse the dopant into what will become the emitter diffusion region) is washed out by a corrosive etchant as in the prior art. The base-emitter junction may be as little as 1000 A from the edge of the passivating layer which marks the boundary of the emitter contact surface. Moreover, metallization directly on such shallow emitter diffusion regions can cause further yield loss due to the probability that the metal will alloy into the semiconductive material and puncture through the emitter region thereby creating an electrical short circuit. Both of these disadvantages are avoided by the use of the present invention method.

I claim:

1. A method of fabricating a semiconductor electrical translating device having at least three active regions therein comprising the steps of:

a. providing a silicon wafer of a first electrical conductivity type, said wafer having disposed therein adjacent a surface a region of a second electrical conductivity type opposite to that of said first electrical conductivity type;

b. disposing a first passivating layer upon said wafer adjacent said surface;

c. forming a plurality of openings in said first passivating layer whereby said surface is exposed;

d. disposing a second passivating layer upon said first passivating layer whereby said first passivating layer and the plurality of openings therein are convered;

e. forming openings through said second passivating layer adjacent some, but not all, of said openings in said first passivating layer whereby said surface is exposed;

f. forming a layer of silicon upon said second passivating layer and in said openings therethrough such that polycrystalline silicon is formed on said second passivating layer and pseudocrystalline silicon is formed in said openings; and g. etching said layer of silicon util substantially all of said layer of polycrystalline silicon disposed upon said second passivating layer is removed whereby said pseudocrystalline silicon remains substantially in place.

2. A method as defined in claim 1 wherein said forming a layer of silicon comprises the steps of:

a. placing said silicon wafer in an epitaxial reactor;

b. growing a layer of pseudocyrstalline silicon of said first electrical conductivity type on said wafer in said openings in said second passivating laers; and
c. growing a layer of polycrystalline silicon upon said second passivating layer.

3. A method as defined in claim 2 wherein said etching of said layer of silicon comprises the steps of:
a. applying to said silicon wafer an anisotropic silicon ethc; and
b. removing said polycrystalline silicon and said pseudocrystalline silicon at a rate in the range of 20–40 to 1, polycrystalline to pseudocrystalline, until said polycrystalline silicon is substantially removed.

4. A method as defined in claim 2 including the steps of:
a. heating said silicon wafer to a temperature and for a period of time sufficient to diffuse a region of said first electrical conductivity type into and through said surface; and
b. removing said second passivating layer and exposing said surface through those openings not adjacent said pseudocrystalline silicon.

5. A method as defined in claim 1 wherein said steps of disposing a first passivating layer comprises depositing a layer of silicon nitride.

6. A method as defined in claim 1 wherein said step of disposing a second passivating layer comprises depositing a layer of silicon dioxide.

7. A method for fabricating a transistor having base, emitter and collector regions comprising the steps of:
a. providing a silicon wafer of a first electrical conductivity type;
b. forming at a surface of said silicon wafer a region of a second electrical conductivity type opposite to that of said first electrical conductivity;
c. disposing upon said surface a selectably etchable first passivating layer;
d. etching a plurality of openings in said first passivating layer exposing said region of said second electrical conductivity type therethrough;
e. disposing upon said first passivating layer and in the openings therethrough a selectably etchable second passivating layer, said second passivating layer being etchable by an etchant which will not react with said first passivating layer;
f. etching openings in said second passivating layer aligned with some, but not all, of said openings in said first passivating layer exposing said region of said second electrical conductivity type therethrough;
g. growing upon said second passivating layer and in said openings therethrough a layer of silicon of said first electrical conductivity type such that polycrystalline silicon is formed on said second passivating layer and pseudocrystalline silicon is formed in said openings; and
h. etching said grown silicon until said second passivating layer is exposed.

8. A method as defined in claim 7 wherein said step of growing comprises the steps of:
a. placing said silicon wafer in an epitaxial reactor;
b. growing a layer of pseudocrystalline silicon in said openings through said second passivating layer and upon said surface of said second electrical conductivity type; and
c. growing a layer of polycrystalline silicon upon said second passivating layer.

9. A method as defined in claim 8 wherein said steps of etching said grown silicon comprises the steps of:
a. applying to said silicon wafer an anisotropic silicon etch; and
b. removing said polycrystalline silicon and said pseudocrystalline silicon at a rate in the range of 20–40 to 1 polycrystalline to pseudocrystalline until said polycrystalline silicon is substantially removed thereby leaving said pseudocrystalline silicon substantially in place.

10. A method as defined in claim 7 wherein a silicon wafer of N-type conductivity is provided.

11. A method as defined in claim 8 wherein said surface of said provided silicon wafer is a pseudocrystalline structure.

12. A method as defined in claim 11 further including the steps of:
a. heating said silicon wafer to a temperature and for a period of time sufficient to diffuse a layer of said first electrical conductivity type into the region beneath said pseudocrystalline structure through those openings not adjacent said openings having pseudocrystalline silicon formed therein.

13. A method for fabricating a transistor comprising the steps of:
a. providing a silicon wafer of N-type conductivity;
b. forming a crystalline region at a surface of said wafer, said region being of P-type conductivity;
c. disposing upon said surface a first passivating layer of silicon nitride;
d. etching said first passivating layer of silicon nitride to form a plurality of openings therein, exposing said crystalline regions therethrough;
e. disposing upon said first passivating layer and in the openings therethrough a second passivating layer of silicon dioxide;
f. etching said second passivating layer to form openings aligned with some, but not all, of the openings in said first papssivating layer exposing the surface of said crystalline regions therethrough;
g. growing a layer of polycrystalline silicon upon said second passivating layer and pseudo-crystalline silicon upon the surface of said exposed crystalline region, said pseudo-crystalline silicon being of N-type conductivity;
h. etching said grown polycrystalline and crystalline silicon unitl said second passivating layer is substantially exposed; and
e. diffusing regions of N-type conductivity into said crystalline region of P-type conductivity.

* * * * *